US008614456B2

United States Patent
Leising

(10) Patent No.: US 8,614,456 B2
(45) Date of Patent: Dec. 24, 2013

(54) LED AND LED LIGHT SOURCE

(75) Inventor: Günther Leising, Graz (AT)

(73) Assignee: Tridonic Optoelectronics GmbH, Jennersdorf (AT)

( * ) Notice: Subject to any disclaimer, the term of this patent is extended or adjusted under 35 U.S.C. 154(b) by 470 days.

(21) Appl. No.: 10/586,386

(22) PCT Filed: Jun. 9, 2004

(86) PCT No.: PCT/EP2004/051066
§ 371 (c)(1),
(2), (4) Date: Oct. 2, 2006

(87) PCT Pub. No.: WO2005/008790
PCT Pub. Date: Jan. 27, 2005

(65) Prior Publication Data
US 2007/0111351 A1 May 17, 2007

(30) Foreign Application Priority Data
Jul. 11, 2003 (AT) ................................ A 1072/2003

(51) Int. Cl.
*H01L 33/00* (2010.01)
(52) U.S. Cl.
USPC 257/99; 257/79; 257/E33.061; 257/E33.057; 257/E33.075
(58) Field of Classification Search
USPC ........ 257/79, 99, E33.061, E33.057, E33.075
See application file for complete search history.

(56) References Cited

U.S. PATENT DOCUMENTS

| | | | |
|---|---|---|---|
| 5,177,593 A * | 1/1993 | Abe | 257/98 |
| 5,389,816 A * | 2/1995 | Shimizu et al. | 257/666 |
| 6,345,903 B1 * | 2/2002 | Koike et al. | 362/249 |
| 6,482,664 B1 * | 11/2002 | Lee et al. | 438/28 |
| 6,498,355 B1 * | 12/2002 | Harrah et al. | 257/99 |
| 6,531,328 B1 | 3/2003 | Chen | 438/26 |
| 6,599,768 B1 * | 7/2003 | Chen | 438/22 |
| 6,614,103 B1 * | 9/2003 | Durocher et al. | 257/678 |
| 6,642,618 B2 * | 11/2003 | Yagi et al. | 257/734 |
| 6,670,648 B2 * | 12/2003 | Isokawa et al. | 257/99 |
| 6,909,123 B2 * | 6/2005 | Hayashimoto et al. | 257/98 |
| 7,244,965 B2 * | 7/2007 | Andrews et al. | 257/98 |
| 2001/0010449 A1 * | 8/2001 | Chiu et al. | 313/501 |

(Continued)

FOREIGN PATENT DOCUMENTS

DE 19963264 6/2001
JP 60 072281 4/1985

(Continued)

*Primary Examiner* — Meiya Li
(74) *Attorney, Agent, or Firm* — Fitzpatrick, Cella, Harper & Scinto

(57) ABSTRACT

An LED die (3) is arranged with an adhesive (4) on an LED PCB (6). The LED PCB (6) has on the side opposite to the LED die (3) rear side contacts (7). Through this a self-contained LED lamp is formed, which e.g. can be applied by means of SMT to a board (9) or introduced into a lamp socket. In accordance with the invention, the rear side contacts (7) cover at least the half area, preferably the entire area apart from necessary exceptions, of the LED PCB (6). Through this, the heat can be discharged with slight thermal resistance. Preferably a cooling body (11) is arranged on the rear side of the board (9). In this case it is expedient if the board (9) has through-contacts for increasing the thermal conductivity.

7 Claims, 2 Drawing Sheets

(56) References Cited

U.S. PATENT DOCUMENTS

| | | | |
|---|---|---|---|
| 2002/0001192 A1* | 1/2002 | Suehiro et al. | 362/240 |
| 2002/0063301 A1* | 5/2002 | Hanamoto et al. | 257/432 |
| 2002/0070449 A1* | 6/2002 | Yagi et al. | 257/734 |
| 2002/0139990 A1* | 10/2002 | Suehiro et al. | 257/99 |
| 2002/0149102 A1* | 10/2002 | Hashemi et al. | 257/706 |
| 2002/0149312 A1* | 10/2002 | Roberts et al. | 313/495 |
| 2002/0167016 A1* | 11/2002 | Hoelen et al. | 257/89 |
| 2002/0175621 A1* | 11/2002 | Song et al. | 313/515 |
| 2002/0185646 A1* | 12/2002 | Fukasawa et al. | 257/79 |
| 2003/0008431 A1* | 1/2003 | Matsubara et al. | 438/98 |
| 2003/0010986 A1* | 1/2003 | Lin et al. | 257/79 |
| 2003/0080341 A1* | 5/2003 | Sakano et al. | 257/79 |
| 2003/0189829 A1* | 10/2003 | Shimizu et al. | 362/240 |
| 2004/0079957 A1* | 4/2004 | Andrews et al. | 257/100 |
| 2004/0099874 A1* | 5/2004 | Chang et al. | 257/98 |
| 2004/0113549 A1* | 6/2004 | Roberts et al. | 313/512 |
| 2004/0188696 A1* | 9/2004 | Hsing Chen et al. | 257/99 |
| 2005/0023548 A1* | 2/2005 | Bhat et al. | 257/99 |
| 2006/0097245 A1* | 5/2006 | Aanegola et al. | 257/26 |

FOREIGN PATENT DOCUMENTS

| | | |
|---|---|---|
| JP | 06 037359 | 2/1994 |
| JP | 08 264841 | 10/1996 |
| JP | 11 168235 | 6/1999 |
| JP | 2000 077822 | 3/2000 |
| JP | 2003 115204 | 4/2003 |
| JP | 2003-017754 | 5/2003 |
| WO | 2004 088760 | 10/2004 |

* cited by examiner

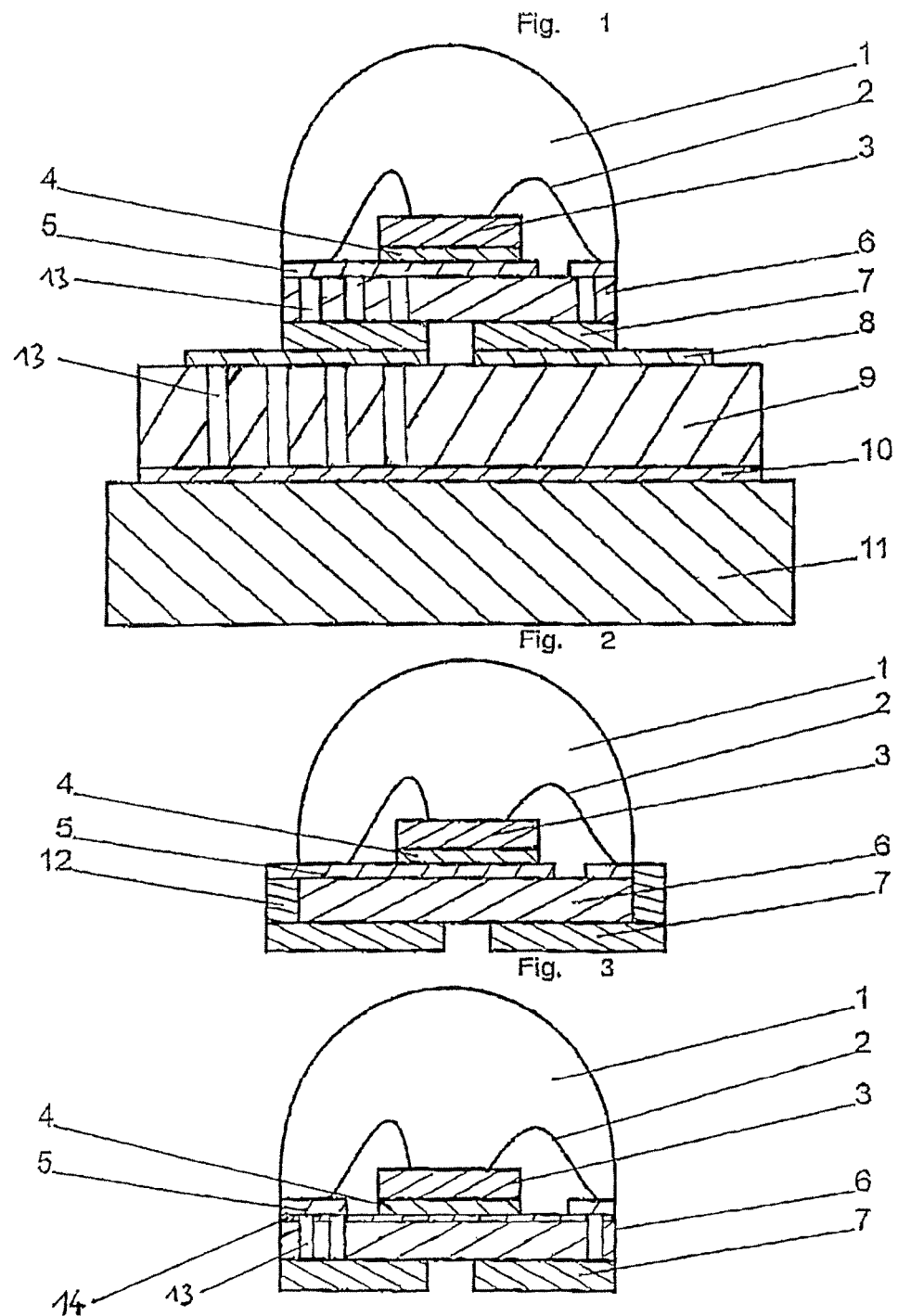

LED AND LED LIGHT SOURCE

This application is a national phase under 35 U.S.C. §371 of International Application No. PCT/EP2004/051066, filed Jun. 9, 2004 which is incorporated by reference herein.

TECHNICAL BACKGROUND

The present invention relates to an LED, in the case of which the at least one LED die is arranged on a LED PCB with a die attach, and the LED PCB has on the side opposite to the LED die electrical rear side contacts, which if appropriate are as plug-in contacts. It further relates to a LED light source having one or more LEDs, of the kind mentioned above, arranged on a board or on a plug, wherein the board has contact surfaces or the plug has contacts, with which the LEDs are contacted.

LED light sources normally have the following structure: The LED die is applied to a contact surface (e.g. conductor path) of an LED PCB by means of a die attach (PCB=printed circuit board; the term die attach includes both a die adhesive connection and also a solder connection). Together with the rear side contacts of the LED PCB this arrangement represents a self-contained LED lamp. This LED lamp is assembled onto a board by means of a mounting technology (e.g. SMT), which board is then optionally connected with a cooling body. Optionally, the lamp may be fixed and contacted in a lamp socket. Instead of on a board, the LED can also be assembled on a plug.

In order to realize LED applications having high brightness, ever stronger high power LEDs are put to use, already even with an operating power of more than 1 $W_{el}$. The chip area of these LEDs is at the present time in the region of 1 $mm^2$. There is a trend that in future the operating power per LED will further increase, which on the one hand will be achieved by means of larger semiconductors and on the other hand by means of higher current densities. In particular the latter parameter has the effect that the power density of LEDs of at present maximally 1-2 $W_{el/mm^2}$ will in future increase above 4 $W_{el}/mm^2$.

However, for the discharge of the waste heat appropriate arrangements are to be realized, which allow the heat to be sufficiently discharged from the semiconductor.

Too great warming during the operation of the LED leads to component destruction. For this reason, during the operation of the LED, it must be ensured that the temperature at the barrier layer of the p-n junction in the LED does not rise above typically 130° C. This can occur during the operation of the LED insofar as only a part of the electrical power taken up by the component is converted to light, whilst the other part is converted to heat. (At the present time, the power efficiency of LEDs is less than 10%). The operating parameters of LEDs are thus to be selected in dependence upon the manner of assembly, the installation and environmental conditions, such that the barrier layer temperature always remains below 130° C.

In the subject invention, arrangements are presented which can discharge the waste heat of LEDs with such efficiency that power densities of over 2 $W_{el}/mm^2$ can be discharged.

In order to efficiently discharge the waste heat, the thermal resistance of the arrangement must be optimized. If the heat can be transferred to the LED carrier without a great temperature difference, the barrier layer remains below the maximum permitted temperature. The significant physical parameter is thus the thermal resistance, measured in K/W.

Arrangements and structures such as are at the present time state of the art for high power LEDs have in optimized arrangements typically a thermal resistance of more than 20 K/W (interface junction to LED carrier material). This means that the temperature difference between the LED carrier and the active zone of the LED—in operation at 5 $W_{el}$—is more than 100 K. Starting from a maximum permissible barrier layer temperature for long term applications of 130° C., this means that employment is impossible at temperatures above 30° C. and thus this LED is unsuitable for many technical applications (automobiles, transport).

DISCLOSURES OF THE INVENTION

Technical Problem

It is the object of the present invention to provide an LED or a LED light source of the kind mentioned in the introduction, in the case of which the thermal resistance is lesser than in accordance with the state of the art.

Technical Solution

This object is achieved in accordance with the invention by means of an LED of the kind mentioned in the introduction in that the rear side contacts cover over at least the half area, preferably the entire area apart from the necessary exceptions, of the LED PCB. The necessary exceptions are e.g. the necessary spacings for electrical insulation of conductor paths at different electrical potential.

Previously, the contact surfaces were always dimensioned only with regard to the electrical resistance and thus provided, in comparison to the invention, of lesser cross-sectional area. In accordance with the invention, however, these contact areas are to be as large as possible, through which the thermal resistance is correspondingly reduced. Thereby it is favorable that the thermal and electrical line is carried perpendicularly thought the carrier material. In this way a structure which is as compact as possible (without spatially extensive lateral side contacts) can be realized.

It is favorable if the rear side contacts are thermally, and if appropriate electrically, connected with the contact surfaces on the side towards the LED die, to the lateral side of the LED PCB. This not only improves the thermal resistance, but also the soldering and contacting characteristics.

In the case of insulating boards (e.g. in the case of organic LED PCBs) one normally applies the LED die to a conductor path. In the case of metal core boards, the conductor paths must however be insulated with respect to the metal core. This insulation layer naturally increases the thermal resistance. For this reason it is expedient that—when the LED PCB is a metal core board—the LED die is directly applied on the metal core.

Alternatively to this, in the case of a metal core board, one can arrange between the conductor paths and the metal core an electrically non-linear insulation material. Since LEDs are operated with relatively low voltage, one can in principle provide the insulation material very thinly, without having to fear a breakdown in operation. However, upon handling a higher voltage can arise, e.g. by means of static charging, which in the case of thin insulation material can lead to a breakdown and thus could make the LED unusable. This is hindered with an electrically non-linear insulation material because above a certain voltage this is conductive. Through this, static electricity is discharged, without damage arising. Thus, with an electrically non-linear insulation material one can make do with a lesser thickness, which correspondingly reduces the thermal resistance.

When the LED is mounted face down on the LED die, the light yield is higher because then no light is shadowed by the otherwise necessary bonding wires.

In the case of an LED light source of the kind mentioned in the introduction, the above-mentioned object is achieved in accordance with the invention in that the rear side contacts of the LED on at least the half area of the LED PCB, preferably over the entire area apart from the necessary exceptions, is soldered with the contact areas or the contacts.

It is favorable if a cooling body is arranged on the rear side of the board. Through this, heat is discharged from the board, without space on the forward side of the board being necessary for this purpose. The cooling body may be any metallic functional body (e.g. a housing) and may be connected thermally with the board with any desired connection technology.

In this case it is further favorable if the board and/or the LED PCB have through-contacts for increasing the thermal conductivity, whereby preferably the through-contacts have a diameter of less than 100 µm. This applies in particular for boards of organic material, the thermal conductivity of which is per se poor.

BRIEF DESCRIPTION OF THE DRAWINGS

The invention will be explained in more detail with reference to the accompanying drawings. There is shown:

FIG. 1 a first exemplary embodiment of an LED light source in accordance with the invention;

FIG. 2 a modification of the LED illustrated in FIG. 1; and

FIG. 3 a further modification of the LED illustrated in FIG. 1.

In accordance with FIG. 1, an LED die 3 ($R_{th,\ LED\ die}$) is applied to a contact surface (e.g. conductor path 5) of an LED PCB 6 ($R_{th,\ LED\ PCB}$) by means of a die adhesive 4. The LED die 3 in FIG. 1 is mounted face up and connected via bonding wires 2 with the contact surfaces (conductor path 5). Alternatively thereto, this can also be arranged in a face down mounting directly on the LED PCB 6 or this can be attached face down to a die carrier, and the latter then arranged on the LED PCB. For example.

Figure 4:
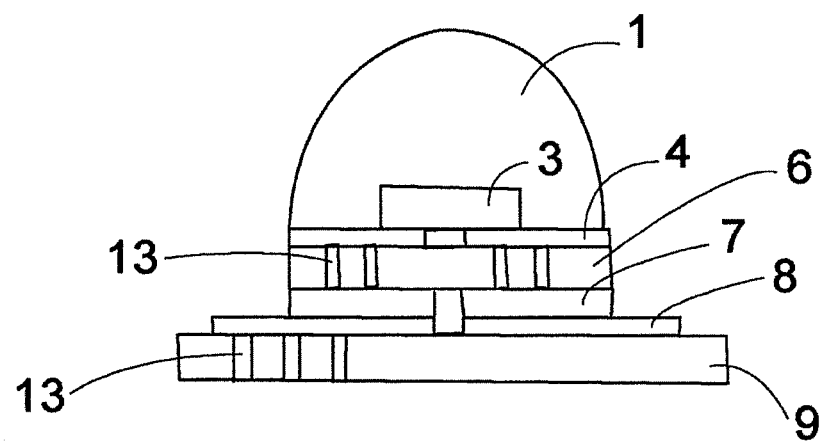
FIG. 4 shows the LED die 3 mounted face down onto LED PCB 6 by means of die attach 4. The LED PCB 6 has at its underside rear side contacts 7. The rear side contacts 7 of the LED PCB 6 at least partially cover over the LED PCB 6, and may cover over at least the half area of the LED PCB 6, or cover the entire area of the LED PCB 6 apart from at least one exception. Together with the rear side contacts 7 ($R_{th,\ solder\ pads}$) of the LED PCB 6 these arrangements represent a self-contained LED lamp. Also, as shown in FIG. 4, the LED PCB 6 includes a plurality of conductive through-vias 13, which thermally and electrically connect the rear side contacts 7 of the LED PCB 6 to contact areas formed on an upper side of the LED PCB 6. For further processing, this LED lamp can be assembled by means of a mounting technology (e.g. SMT) on a board 9 ($R_{th,\ board}$), which is then optionally connected with a cooling body 11, e.g. via a solder area 10 ($R_{th,\ solder\ area}$). For example, in the embodiment shown in FIG. 4, the LED lamp is arranged on the additional board 9, which includes on an upper side thereof, contact areas 8. The contact areas 8 may be soldered to the rear side contacts 7 of the LED PCB 6. The additional board 9 also includes conductive through-vias 13 in the additional board 9. The conductive through-vias 13 in the additional board 9 thermally and electrically connect at least one of the contact areas 8 of the additional board 9 to a solder area formed at an underside of the additional board 9.

The LED die 3 is normally cast in a material 1 having appropriate optical characteristics. The LED die can also—as is known—be placed in a reflector. Of course, also a plurality of LED dies can be cast together or put in place in a reflector.

The typical thermal resistance of the overall arrangement in accordance with FIG. 1 is made up as follows:

$$R_{th} = R_{th,\ LED\ die}(4\ K/W) + R_{th,\ die\ adhesive}(2\ K/W) + R_{th,\ LED\ PCB}(5\ K/W) + R_{th,\ solder\ pads}(3\ K/W) + R_{th,\ board}(2\ K/W) + R_{th,\ solder\ area}(2\ K/W) = 18\ K/W$$

In order to improve the soldering characteristics and the heat discharge via the rear side, it is expedient (in particular in the case of ceramic boards and organic PCBs) to provide lateral side contact layers 12 (see FIG. 2) which thermally, and if applicable electrically, connect the upper side of the PCB with the underside of the PCB. Through this, the solder characteristics of the LED arrangement are improved both in the case of manual soldering and also in automatic equipment (SMT wave or reflow soldering) by means of better solder engagement and better thermal distribution. Further, the solder point can be better judged from the exterior.

In accordance with FIG. 3, the LED die 3 is not placed on a conductor path 5 but directly on the core of the LED PCB 6. This is sensible particularly in the case of metal core boards, because here there is needed between the conductor paths 5 and the metal core a thin insulation layer in order to electrically insulate the conductor paths 5. This insulation layer also increases the thermal resistance, so that the direct arrangement of the LED die 3 on the metal core of the LED PCB 6 has a smaller thermal resistance.

In the exemplary embodiments die adhesive is always mentioned, but alternatively the dies could also be soldered on.

In order to optimize the thermal resistance for high power applications, the thermal resistances of the individual components are to be kept as small as possible.

Hereby it is to be taken into account that by means of an increase of the area of the components after the transition to the LED carrier, although the thermal resistance reduces linearly, on the other hand with regard to a high integration density an increase in size of this area is undesired for many applications.

It is thus more favorable to optimize the material-specific thermal conductivity of the individual materials or beyond this to select the layer thickness of the components as thin as possible.

The following possibilities are available:

I Use of conductive adhesive d<10 µm having a conductivity above 2 W/mK

II Use of solder contact layers having thermal conductivity above 20 W/mK and a layer thickness below 30 µm III Contact area/carrier material Fundamentally, for this purpose the following different materials can be put to use:

III.1 Ceramics

Ceramics have a ceramic substrate with thin layer or thick layer metallisation thereon. In order to discharge the high power densities, preferably AlN or BN are put to use, or one employs AlO in very thin layers.

III.2 Metal Core Boards

Metal core boards are e.g. of Cu or Al. These are provided with non-conducting layers, and thereon conductor paths are arranged (either galvanically or by means of coating by means of an adhesion—/welding method).

The insulation layer may either be of organic material or thin ceramic (the latter is e.g. applied as a slurry onto the metal carrier or coated with fired ceramic tapes).

In order to further optimize the thermal resistance of the arrangement, non-conducting layers as thin as possible (thinner than 50 µm) are preferably to be put to use. This is fundamentally possible in LED applications, since LEDs typically are operated with a d.c. voltage of a few volts, so that no great breakdown field strengths arise. However, upon handling of the circuit board, electrical discharges can arise. In order to lead these electrical discharges away, in a preferred variant of the invention the insulator layers of the metal core board are provided to be electrically non-linear in a manner that these are electrically insulating at low voltages (e.g. below 100 V), whilst they become electrically conducting at high voltages (e.g. above 100 V). Such electrically non-linear materials are known in the state of the art. Alternatively thereto, the LED die can be directly placed on the metal core (FIG. 3). Hereby, the lowest thermal resistances are achieved, and one can, without problems, apply thick insulator layers.

The disadvantage of this arrangement is that for the structure in accordance with FIG. 1 special efforts are needed in order to effect the electrical contacting via the rear side.

This can be effected e.g. by means of the arrangement of outwardly insulating metal cylinders, which can be contacted from above and below.

III.3 Organic PCBs

In contrast to the above-presented variants, the thermal conductivity of the carrier material of an organic PCB is very poor (only 0.1-0.2 W/mK). In order, despite this, to realize a sufficient thermal conductivity with these materials, one can provide in the direct vicinity of the die through-contacts which are at least partly filled with Cu. The greater the number of through-contacts, the lesser will be the thermal resistance. In order to sufficiently spread the heat for this purpose, metallisation layer thicknesses of above 100 µm, preferably above 200 µm are necessary. Typically, these channels have a diameter of a few tenths of a mm. In an optimized variant the diameter of the channels is only a few micro- or nano-meters. In this manner, a substrate with very highly anisotropic electrical and thermal conductivity is realized.

The invention claimed is:

1. A light emitting diode, comprising:
   at least one light emitting diode die, arranged on a light emitting diode printed circuit board by means of a die attach, the light emitting diode printed circuit board comprising at a lower surface thereof rear side contacts, wherein the rear side contacts of the light emitting diode printed circuit board at least partially overlap with contours of the light emitting diode die and are formed in such a way as to overlap with at least half of the lower surface of the light emitting diode printed circuit board, and
   wherein the light emitting diode printed circuit board comprises a plurality of conductive through-vias in the light emitting diode printed circuit board, the through-vias thermally and electrically connecting the rear side contacts of the light emitting diode printed circuit board to contact areas formed on an upper surface of the light emitting diode printed circuit board.

2. The light emitting diode of claim 1, wherein the light emitting diode printed circuit board is a metal core printed circuit board having a metal core, and wherein the light emitting diode die is located on the metal core.

3. The light emitting diode of claim 1 or 2, wherein the light emitting diode die is mounted face down to the light emitting diode printed circuit board.

4. A light emitting diode according to claim 1, wherein the light emitting diode printed circuit board is a metal core printed circuit board and wherein a non-linear isolator material layer is arranged between at least one of the contact areas and the metal core printed circuit board.

5. A light emitting diode light source comprising:
   at least one light emitting diode, wherein each light emitting diode comprises at least one light emitting diode die, arranged on a light emitting diode printed circuit board by means of a die attach, the light emitting diode printed circuit board comprising at a lower surface thereof rear side contacts, wherein the rear side contacts of the light emitting diode printed circuit board at least partially overlap with contours of the light emitting diode die and wherein the rear side contacts of the light emitting diode printed circuit board overlap with at least half of the lower surface of the light emitting diode printed circuit board, and wherein the light emitting diode printed circuit board comprises a plurality of conductive through-vias in the light emitting diode printed circuit board, the through-vias thermally and electrically connecting the rear side contacts to contact areas formed on an upper surface of the light emitting diode printed circuit board, the light emitting diode being arranged on an additional board,
   wherein the additional board comprises on an upper surface thereof further contact areas which are soldered to the rear side contacts of the light emitting diode printed circuit board,
   wherein a total surface area of the further contact areas is at least half of the area of the lower surface of the light emitting diode printed circuit board, and
   wherein the additional board comprises a further plurality of conductive through-vias in the additional board, the through-vias thermally and electrically connecting at least one of the further contact areas to a solder area formed at a lower surface of the additional board.

6. A light emitting diode light source according to claim 5, wherein a cooling body is located at a rear side of the additional board.

7. The light emitting diode light source of claim 5, wherein at least one of the plurality of through-vias of the light emitting diode printed circuit board and at least one of the further plurality of through-vias of the additional board have a diameter of less than 100 µm.

* * * * *